United States Patent [19]

Hall

[11] 4,074,347
[45] Feb. 14, 1978

[54] VARACTOR FREQUENCY MULTIPLIER AND SWITCHING CIRCUIT

[75] Inventor: Roger D. Hall, Encino, Calif.

[73] Assignee: The Bendix Corporation, North Hollywood, Calif.

[21] Appl. No.: 724,190

[22] Filed: Sept. 17, 1976

[51] Int. Cl.² ............................................. H02M 5/06
[52] U.S. Cl. ..................................... 363/158; 363/159
[58] Field of Search ................... 321/69 NL; 330/4.9; 331/76; 363/158, 159

[56] References Cited

U.S. PATENT DOCUMENTS

| | | | |
|---|---|---|---|
| 3,185,914 | 5/1965 | Gunn | 321/69 NL |
| 3,358,215 | 12/1967 | Swan | 321/69 NL |
| 3,611,110 | 10/1971 | Corbey et al. | 330/4.9 |
| 3,713,014 | 1/1973 | Wagner | 321/69 NL |

*Primary Examiner*—Gerald Goldberg
*Attorney, Agent, or Firm*—Robert C. Smith; William F. Thornton

[57] ABSTRACT

A varactor multiplier circuit is driven by a pulsed source of radio frequency and self-biased such that it operates in its snap condition to generate harmonic frequencies. The output pulse has essentially the same configuration and length as the input pulse. These pulse envelopes may have a relatively slow voltage build-up with time. A separate bias drive circuit is directly connected to the varactor and provides a negative-going pulse of sufficient voltage to bias the varactor to its off condition. This gating bias pulse is variable as to pulse width and is very steeply rising and serves to either turn on or cut off the varactor sharply to thus provide a shaped envelope of the output wave form. An isolating capacitor and a band stop filter operate to prevent loading of the multiplier circuit by the bias drive circuit and to prevent radio frequency leakage into the drive circuit. A bandpass filter at the output of the varactor circuit serves to limit the output frequency to the desired harmonic of the input signal. This arrangement permits switching of high frequency signals at comparatively high power without the use of a separate gating stage with its accompanying insertion loss.

9 Claims, 7 Drawing Figures

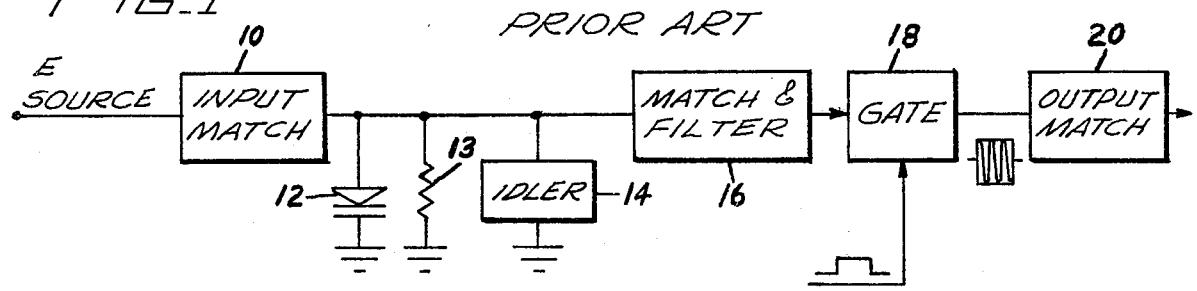
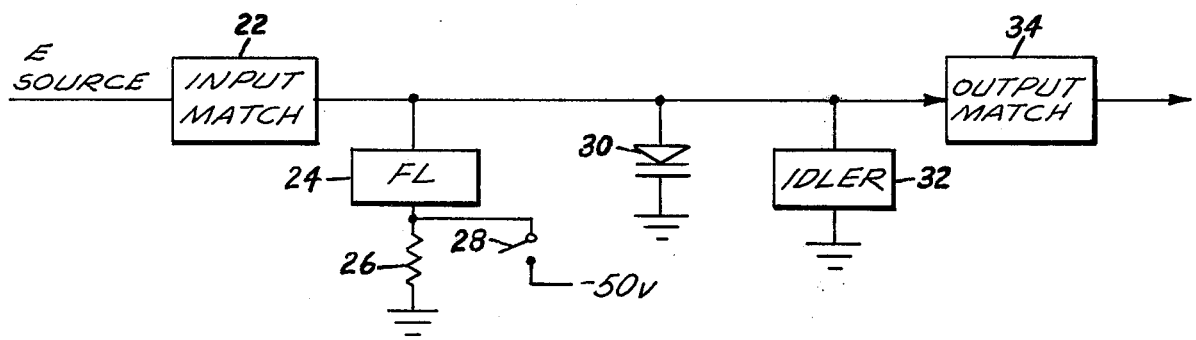
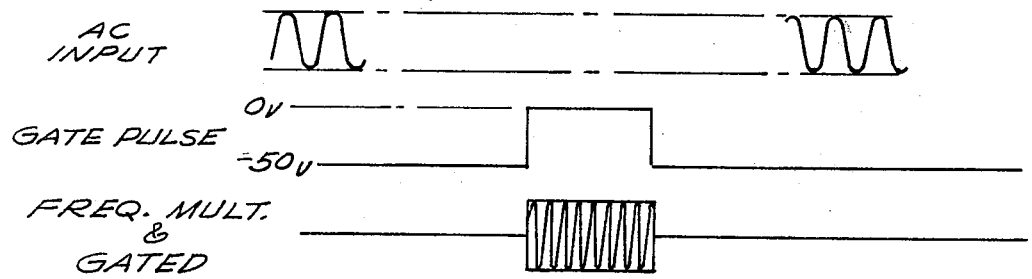
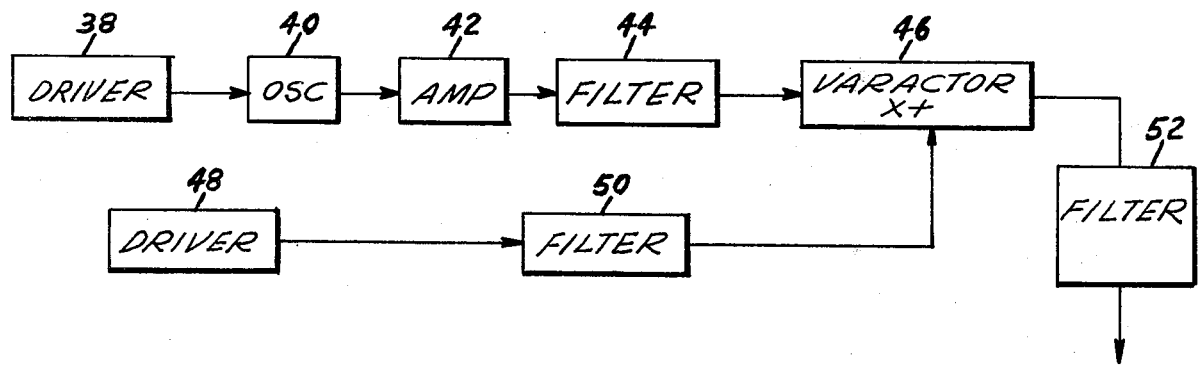

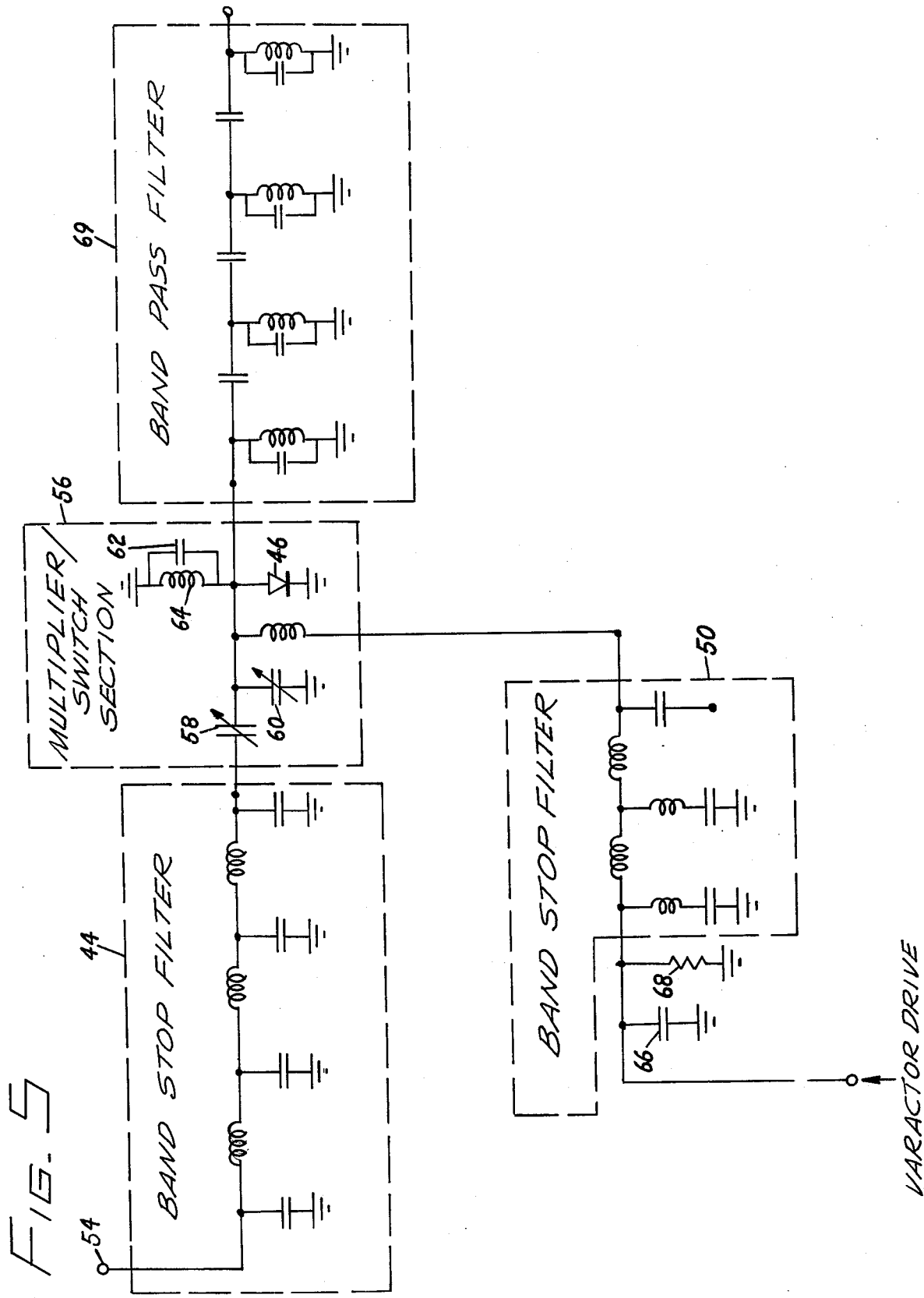

Fig. 6
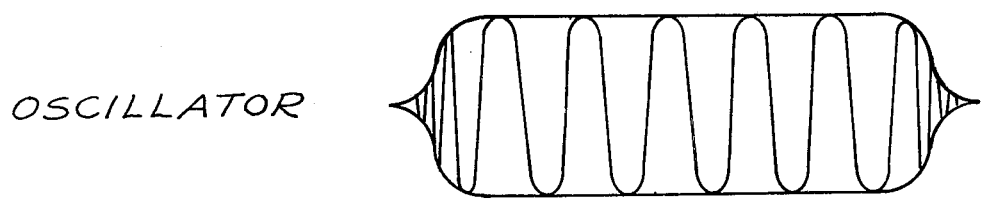
OSCILLATOR
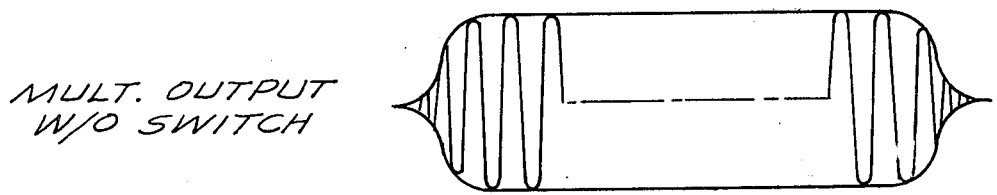
MULT. OUTPUT W/O SWITCH
SELF-BIAS VOLTAGE DEVELOPED
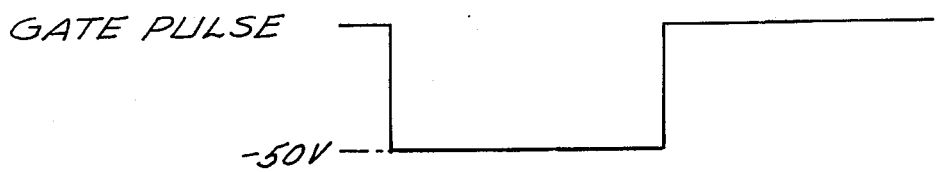
GATE PULSE
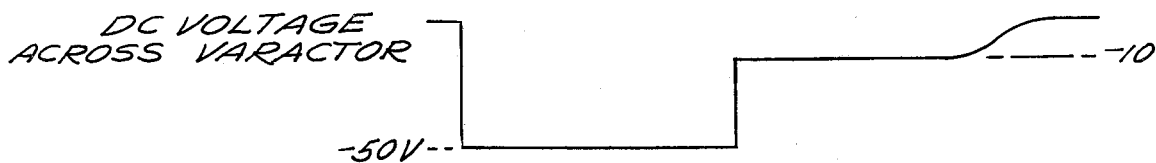
DC VOLTAGE ACROSS VARACTOR
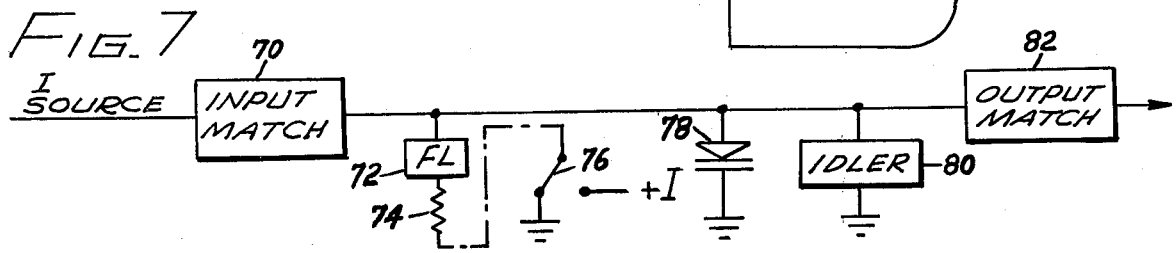
FINAL OUTPUT PULSE (GATED)
Fig. 7

VARACTOR FREQUENCY MULTIPLIER AND SWITCHING CIRCUIT

BACKGROUND OF THE INVENTION

The use of varactors, which are actually semiconductor diodes having measurable and predictable capacitance, as frequency multipliers has been quite usual and many are sold every year for this purpose. The usual arrangement is that an alternating voltage is supplied across the varactor which is connected into the circuit such that it becomes self-biased to operate in a "snap" condition. As is well known to those skilled in the art, in this condition the varactor generates numerous harmonic frequencies, and through the use of an appropriate band pass filter, a desired harmonic frequency may be selected. It is quite common to use a varactor in this manner to generate frequencies of two, three or four times the input frequency. Other multiples are also possible, sometimes at the cost of some complication in associated circuitry. It is inherent in the operation of such circuits that the harmonic frequencies tend to build up and decay somewhat slowly, thus giving rise to envelopes with relatively poorly defined leading and trailing edges.

Where operating at high frequencies (one to five GHz) and at comparatively high power levels (100 watts), it is often difficult to switch the multiplied frequencies to create sharp cut-off and/or turn-on of the signal without adding additional components and related high insertion loss. In the case of echo ranging devices such as radar altimeters, it is essential that the leading or trailing edges of such multiplied pulses be precisely defined and controllable. The usual method of accomplishing this switching function is to place a gating circuit downstream of the varactor which operates to switch the varactor output off and on as desired. This gate circuit becomes an element of cost and, in some applications, creates a special problem in that it also adds an increasing insertion loss as the developed output power increases. In some applications this insertion loss is either intolerable or, at the least, very undesirable. There is, therefore, a need for a varactor frequency multiplying circuit which can be switched controllably and precisely and without incurring additional insertion losses as a trade-off for increasing output power.

DESCRIPTION OF THE DRAWINGS

FIG. 1 is a schematic drawing of a typical generalized prior art varactor multiplier circuit.

FIG. 2 is a schematic drawing of a generalized varactor multiplier circuit incorporating my invention.

FIG. 3 is a set of wave forms descriptive of the operation of the embodiment of FIG. 2.

FIG. 4 is a block diagram of a portion of a radar altimeter system with a varactor multiplier incorporating my invention.

FIG. 5 is a detailed schematic drawing of a varactor multiplier circuit of the kind which may be used in the system of FIG. 4.

FIG. 6 is a set of wave forms descriptive of the operation of the circuit of FIG. 5.

FIG. 7 is a schematic drawing of another embodiment of varactor multiplier incorporating my invention.

DESCRIPTION OF THE PREFERRED EMBODIMENT

Referring now to FIG. 1, an alternating voltage signal is supplied to an input circuit 10 whose function is filtering and impedance matching and across a varactor diode 12, a bias resistor 13 and an idler circuit 14. Varactor diode 12 is self-biased to cause it to operate in its snap condition, generating harmonic frequencies as described above. A given frequency into the match circuit 10 is multiplied by the varactor circuit, with undesired frequencies being blocked by means of the idler 14 and filter matching circuit 16. The output of circuit 16 is a multiplied frequency which may be in an envelope showing a somewhat slow rise and decay time if the input is a pulsed signal. To shape this signal to have a sharp leading edge, for example, a pulse is supplied to a gate 18 whose duration and timing are such as to block the further transmission of the multiplied signal until the phase has passed. At the end of the pulse, the multiplied transmission starts immediately with a sharp leading edge. An additional matching circuit 20, which may be a filter, is interposed between gate 18 and the next stage. As indicated above, this arrangement will accomplish the desired switching but at the cost of some insertion loss and limited power handling capability.

FIG. 2 is a schematic drawing which shows, on a generalized basis, a varactor multiplier circuit incorporating my invention. An alternating (radio frequency) voltage (see FIG. 3) is supplied to an input match circuit 22 for impedance matching and filtering. A drive circuit including a filter 24, a bias resistor 26 and a switch 28 which is movable between ground potential and −50 volts is connected to a varactor 30. In parallel with the varactor 30 is an idler circuit 32. An impedance matching and filtering circuit 34 connects the varactor output to the following stage. When switch 28 is in the position shown, the varactor circuit operates as described above. When the switch is moved to the opposite position, a bias of −50 volts is connected to varactor 30, effectively biasing the varactor to its off position. It remains off until the switch is again moved to the ground position, at which time the self-bias is again such as to cause the varactor to generate harmonic frequencies. As will be seen from consideration of the wave forms of FIG. 3, the output is blocked when the bias is such as to cause the varactor to be cut off.

FIG. 4 is a block diagram of the radio frequency portion of a radar altimeter transmitter which is of a type conventional in all respects except for the varactor multiplying and switching arrangement. A driver 38 drives an oscillator 40 to produce an alternating signal of high frequency such as 1075 MHz. This high frequency signal is amplified in an amplifier 42 and is then supplied to a filter 44, which is preferably a radio frequency band stop filter which tends to block or provide high insertion loss for frequencies extending from just above 1075 MHz to just below 4.3GHz, and from thence to the varactor multiplier 46. Also connected to the varactor multiplier is a switching circuit consisting essentially of a driver 48 and a band stop filter 50. The switching circuit shapes the pulse of multiplied varactor output signals which is then supplied to a band pass filter 52 which discriminates against all harmonics of the input frequency except that multiplied by four or 4.3 GHz.

The varactor multiplier circuit is shown in greater detail in FIG. 5 where the components which may be identical to those of FIG. 4 are given the same numerals. A high frequency input signal of 1075 MHz is supplied to an input terminal 54 of the band stop filter 44 which is designed to effectively block or cause large insertion losses of frequencies from just above 1075 MHz to just below 4.3 GHz. This filtered signal is matched to the varactor 46 in the multiplier/switch section 56 by means of variable capacitors 58 and 60. The varactor idler circuit consists of a capacitor 62 in parallel with an inductor 64. While these components are shown in schematic form, the reader will understand that, at the frequencies under consideration, these are largely stripline components and will not necessarily be in the form of discrete coils, etc. The switching circuit is connected directly to the varactor 46 and consists of a band stop filter 50 (actually a form of low-pass filter) which effectively blocks frequencies above about 500 MHz. In addition to this filter a capacitor 66 assists in providing isolation of the varactor switch drive circuit 48 (FIG. 4) from the radio frequencies in varactor/switch section 56. A resistor 68 sets the self-bias or bias resulting from the applied radio frequency voltage. For the particular design discussed herein this is about −10 volts. The output of the circuit is filtered by means of a conventional band pass filter 69.

The multiplied radio frequency pulse envelope of the multiplier is a close approximation in shape of the input pulse, as may be seen in FIG. 6 wherein voltages are plotted (vertically) against time (horizontally). The first two graphs are representations of the oscillator 40 output and the varactor 46 output in the absence of a switching signal from the driver 48 and filter 50 (FIG. 4). The third graph is a representation of the self-bias voltage developed as a result of the impressed radio frequency input. The fourth graph represents a typical switching pulse from the driver 48 and filter 50, and the fifth graph shows the combined bias on varactor 46 when both the self-bias and switching bias signals are present. It will be recognized that the width of the switching pulse may be varied over a substantial part of the radio frequency pulse width so that the final gated output pulse as shown in the sixth graph may be controlled to begin at any part of the nominal radio frequency pulse. Similarly, the gating pulse may be caused to start at any point along the radio frequency pulse to provide a sharp cut-off. The pulse may also be controlled as shown in FIG. 3 to provide both a sharp leading edge and a sharp cut-off within the time span of the radio frequency input signal.

FIG. 7 is a schematic of another embodiment of my varactor multiplying/switching circuit which is similar to that described in connection with FIG. 2 but differs in that the input is essentially a varying current source. In this arrangement the input signal is supplied to an input match and filter circuit 70 and across a drive circuit comprising a filter 72 a bias resistor 74 and a switch 76 movable between a ground terminal and a source of current. A varactor 78 and an idler circuit 80 are also connected across the input signal. An output match circuit 82 connects the multiplied and switched output to the succeeding stage, which may be a coupler to a transmitting antenna. The current source to which the switch 76 is movable is sufficient to drive and hold the varactor 78 in its forward conducting mode such that it generates no harmonic frequencies. When the switch 76 is at ground position, as shown, the bias is such that harmonic frequencies are generated by varactor 78. By switching the bias as described, the multiplied output pulse is shaped essentially as described above. The varactor output differs only in that it tends to be in its forward conducting mode rather than its turned-off mode when not operating as a multiplier and the resulting direct current is directly grounded and thus kept out of the output.

From the foregoing, it will be recognized that the above described invention provides a very facile and economical way of switching high frequency signals at comparatively high power with the same varactor which accomplishes the frequency multiplication. It also provides a very useful way of shaping or contouring the output pulse because of the manner in which the gating pulse can be controlled as to its timing.

I claim:

1. A frequency multiplying circuit including a varactor, a source of pulses of high frequency voltage of substantial power, filter means connected between said source and said varactor, an idler circuit connected to said varactor and band pass filter means connected to the output of said varactor, said varactor being self-biased such that it reaches a snap condition during which it generates harmonic frequencies:

wherein the improvement comprises a drive circuit connected to said varactor including means supplying a negative-going gating pulse of voltage sufficient to bias said varactor to its off condition.

2. A frequency multiplying circuit as set forth in claim 1 wherein the timing of said gating pulse is controlled to precisely control the initiation of a pulse of multiplied frequency from said varactor.

3. A frequency multiplying circuit as set forth in claim 1 wherein said drive circuit provides a gating pulse whose width is controllable to control the width of the pulse of multiplied frequency from said varactor.

4. A frequency multiplying circuit as set forth in claim 1 wherein said filter means comprises a band stop filter and a by-pass capacitor is connected in said drive circuit, said bandstop filter and said by-pass capacitor providing isolation between said source and said drive circuit.

5. A frequency multiplying circuit including a varactor, a source of alternating frequency voltage, filter means connected between said source and said varactor, an idler circuit connected to said varactor and band pass filter means connected to the output of said varactor, said varactor being self-biased such that it reaches a snap condition during which it generates harmonic frequencies:

characterized in that a drive circuit is connected to said varactor, said drive circuit including means biasing said varactor into its snap condition whereby harmonic frequencies are generated for frequency multiplication and switching means biasing said varactor such that no harmonic frequencies are generated by said varactor.

6. A frequency multiplying circuit as set forth in claim 5 wherein said filter means is a bandstop filter and a by-pass capacitor is connected in said drive circuit, said bandstop filter and said by-pass capacitor providing isolation between said source and said drive circuit.

7. A frequency multiplying circuit as set forth in claim 5 wherein said switching means provides a steeply rising gating pulse of voltage sufficient to bias said varactor to its off position.

8. A frequency multiplying circuit as set forth in claim 5 wherein said drive circuit normally biases said varactor to its off condition and timed gating pulses are supplied to precisely control the initiation of a pulse of multiplied frequency from said varactor.

9. A frequency multiplying circuit as set forth in claim 5 wherein said drive circuit normally biases said varactor into its forward conducting condition and provides gating pulses biasing said varactor to its snap condition.

* * * * *